United States Patent [19]
Lal et al.

[11] Patent Number: 5,580,667
[45] Date of Patent: Dec. 3, 1996

[54] MULTILAYERED MEDIUM WITH GRADIENT ISOLATION LAYER

[75] Inventors: Brij B. Lal, San Jose, Calif.; Tadashi Shinohara, Niiharu-gun, Japan

[73] Assignee: HMT Technology Corporation, Fremont, Calif.

[21] Appl. No.: 41,943

[22] Filed: Apr. 2, 1993

Related U.S. Application Data

[63] Continuation-in-part of Ser. No. 907,774, Jun. 30, 1992, Pat. No. 5,432,012, and Ser. No. 995,879, Dec. 23, 1992, Pat. No. 5,356,522.

[51] Int. Cl.$^6$ .................... G11B 5/66; B22D 25/00
[52] U.S. Cl. ............ 428/610; 428/336; 428/694 T; 428/694 TS; 428/694 TM; 428/666; 428/678; 428/667; 428/900
[58] Field of Search .................. 428/694 T, 694 TS, 428/694 TM, 900, 666, 667, 610, 336, 678

[56] References Cited

U.S. PATENT DOCUMENTS

| | | | |
|---|---|---|---|
| 4,654,276 | 3/1987 | Ahlert | 428/641 |
| 4,743,491 | 5/1988 | Asada | 428/213 |
| 4,920,013 | 4/1990 | Kobayashi | 428/694 TM |
| 5,006,388 | 4/1991 | Kuzuo et al. | 428/65.7 |
| 5,069,983 | 12/1991 | Nakamura et al. | 428/611 |
| 5,324,593 | 6/1994 | Lal | 428/610 |
| 5,356,522 | 10/1994 | Lal | 204/192.15 |

FOREIGN PATENT DOCUMENTS 0304873  3/1989  European Pat. Off..

OTHER PUBLICATIONS

Hata H. et al. J. Appl. Phys. 67(9):4692–4694 (1990).
Hata H. et al. IEEE Trans. Mag. 26(5):2709–2711 (1990).
Katayama et al IEEE Trans. Mag. 24(6):2982–2984 (1988).
Ranjan, et al. J Appl. Phys. 69(8):4727–4729 (1991).

*Primary Examiner*—Leszek Kiliman
*Attorney, Agent, or Firm*—Peter J. Dehlinger; Judy M. Mohr

[57] ABSTRACT

A thin-film multilayered recording medium is disclosed. The medium contains two or more magnetic thin-film sublayers separated by an isolation layer having an axial composition gradient.

11 Claims, 4 Drawing Sheets

MULTILAYERED MEDIUM WITH GRADIENT ISOLATION LAYER

This application is a continuation-in-part of U.S. patent application for "Thin-Film Medium with Compositional Gradient" Ser. No. 07/907,774, now U.S. Pat. No. 5,432,012, filed Jun. 30, 1992, and U.S. patent application for "Thin-Film Medium with Chromium Underlayer Gradient" Ser. No. 07/995,879, filed Dec. 23, 1992, now allowed U.S. Pat. No. 5,356,522.

FIELD OF THE INVENTION

The present invention relates to a multilayered thin-film magnetic recording medium having a gradient isolation layer.

REFERENCES

Futamoto, M., et al., IEEE Transactions on Magnetics 27(6):5280 (1991).

Hata, H., et al., IEEE Transactions on Magnetics 26(5):2709 (1988).

Hata, H., et al., J. Appl. Phys. 67(9):4692 (1990).

Katayama, S., et al., IEEE Transactions on Magentics 24(6):2982 (1988).

Lambert, S. E., et al., IEEE Transactions on Magnetics 26(5):2706 (1990).

Miller, M. S., et al., J. Appl. Phys. 69(8):4715 (1991).

Ranjan, R., et al., J. Appl. Phys. 69(8):4727 (1991).

Sanders, I. L., et al., IEEE Transactions on Magnetics 25(5):3869 (1989).

Tsang, C., et al., IEEE Transactions on Magnetics 26(5):1689 (1990).

Yogi, T., et al., IEEE Transactions on Magnetics 26(5):2271 (1990).

White, R. (ed.), Introduction to Magnetic Recording, IEEE Press, N.Y. (1985).

BACKGROUND OF THE INVENTION

Thin-film hard disc magnetic media are widely used for on-line data storage in computers. In recent years, considerable effort has been devoted to achieving higher areal recording density. Higher recording densities can be achieved using recording heads with narrower trackwidth and reduced gap (Futamoto; Tsang), high linear resolution, low noise, and high signal-to-noise ratio (SNR) (Yogi), and reduced flying height, i.e., spacing between the flying head and media (White).

Several approaches for reducing noise in thin-film recording media, for increasing disc performance and areal recording density, have been reported. In general, these approaches are aimed at achieving greater grain isolation in the magnetic layer, to reduce inter-grain exchange coupling (Hata). One approach to increasing grain isolation is based on compositional segregation. Reduced noise can be achieved, for example, in a Co-based alloy, such as Co/Cr/Ta, where non-magnetic alloy components, such as Cr and Ta, serve to isolate the magnetic grains in the magnetic layer.

Another approach for reducing media noise is based on physical grain separation, and uses process conditions and layer thickness to increase grain isolation in a magnetic layer. Higher sputter pressure, for example, is known to lead to greater grain isolation in a magnetic layer. Increasing Cr underlayer thickness, in the range above about 2,000 Å, reduces media noise, apparently by increasing grain isolation in a magnetic film sputtered over the underlayer. In general, grain isolation can be expected to decrease with decreasing layer thickness, and several reports have shown that media formed with a Co-based magnetic layer exhibit lower noise as the thickness of the magnetic layer decreases (Lambert, Sanders). The reduction in media noise was accompanied by a reduction in coercive squareness, which is associated with intergrain coupling (Hata).

A limitation in reducing magnetic film thickness, in reducing media noise, is that the amplitude of the read-back signal also falls with reduced film thickness, limiting the signal-to-noise ratio achievable with a thin magnetic layer. One solution to this problem, which has been described in several reports, is to divide the magnetic layer into two or more thinner layers separated by nonmagnetic isolation sublayers. The multilayered configuration preserves the low noise characteristics of the thin, isolated layers, but has signal amplitude characteristics related to the combined thicknesses of the magnetic layers.

The multilayered configuration thus combines low noise and high signal-to-noise characteristics. In addition, high media coercivity can be achieved with a multilayered configuration. However, commercial production of such media has been limited heretofore by the additional target-materials expense, processing steps, and sputtering-machine modifications needed to produce a multilayered medium.

SUMMARY OF THE INVENTION

The present invention includes a multilayered magnetic thin-film medium composed of (i) a substrate, (ii) a sputtered Cr underlayer formed on the substrate, (iii) lower and upper thin-film magnetic layers, each composed of a Co-based magnetic alloy, (iv) an isolation layer formed of a nonmagnetic metal separating the two thin-film magnetic layers, and (v) a protective overcoat. The sputtered isolation layer has an axial composition gradient containing progressively more of the nonmagnetic metal progressing away from the plane of an adjacent sublayer formed of a selected Co-based alloy and progressively more of the selected Co-based magnetic alloy on progressing toward this sublayer. The medium may also include a compositional gradient between the Cr underlayer and lower thin-film magnetic film sublayer.

Where the substrate is an aluminum substrate with a nickel-phosphorus coating, the Cr underlayer has a preferred thickness of between about 200 and 4,000 Å. Where the substrate is a nonmetallic substrate, the Cr underlayer is a sputtered underlayer having an axial composition gradient in which a lowermost stratum of the layer, immediately adjacent the substrate, is composed of a coating metal of Ti, Ti/W, W, Mo, Zr, Sn, Zn, Si, Nb, Ta, Hf, Au, Ag, Cu, V, B or rare-earth elements, and the uppermost stratum of the underlayer is composed of Cr.

The nonmagnetic metal in the isolation layer may be Cr, Ti, Mo, Zr, Al, W, Si, Nb, Ta, Y, Hf, Au, Ag, V, B, Gd, Cu, Re or Ru, and is preferably Cr or a Cr-containing alloy. In a preferred embodiment, the isolation layer contains Cr as its nonmagnetic metal and has a thickness between about 20 and 100 Å. Also in one embodiment, the sputtered isolation layer is a gradient layer containing progressively more of the nonmagnetic metal on progressing away from each of the magnetic layers separated by the isolation layer.

Each of the thin-film magnetic layers has a preferred thickness between about 50 and 300 Å. In one embodiment, both sublayers are composed of the same magnetic alloy, e.g., Co/Cr/Ta alloy. In another embodiment, the lower thin-film sublayer is composed of a first Co-based alloy having relatively low noise and magnetic remanence characteristics, when deposited by sputtering as a single magnetic layer, and the upper thin-film sublayer is composed of a second Co-based alloy having relatively high magnetic remanence characteristics. For example, the lower thin-film sublayer may be composed of a Co/Cr/Ta alloy, and the upper thin-film sublayer may be composed of a Co/Cr or Co/Cr/Ta alloy also containing Ni and/or Pt.

These and other objects and features of the invention will become more fully apparent when the following detailed description of the invention is read in conjunction with the accompanying drawings.

DETAILED DESCRIPTION OF THE INVENTION

I. Thin-Film Medium

Figure 1:
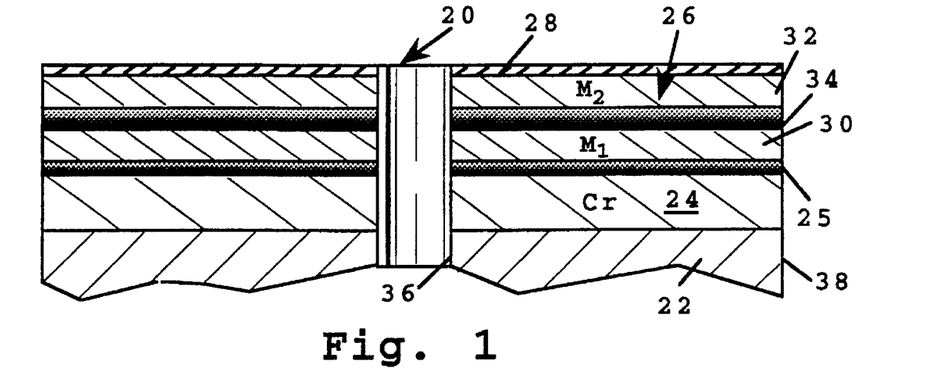
FIG. 1 is a cross-sectional view of a thin-film magnetic disc formed in accordance with one embodiment of the invention.

FIG. 1 shows in cross sectional view, a fragmentary portion of a thin-film recording medium or disc 20 formed in accordance with one embodiment of the present invention. The medium generally includes a rigid substrate 22, and forming successive sputtered thin-film layers over the substrate, a crystalline underlayer 24, a gradient layer 25, a multilayered magnetic thin-film structure 26, and a protective overcoat 28. Structure 26 is composed of a lower sputtered magnetic thin-film sublayer 30 having an alloy composition $M_1$, an upper sputtered magnetic thin-film sputtered sublayer 32 having an alloy composition $M_2$, and a sputtered gradient isolation layer 34 separating the two magnetic sublayers.

The substrate may be a textured substrate, such as a conventional surface-coated, textured aluminum substrate of the type used commonly for digital recording medium. Typically, the substrate is first plated with a selected alloy plating, such as a nickel/phosphorus plating, to achieve a requisite surface hardness, with the thickness of the plating (not shown) being about 300–700 micro-inches.

Two conventional size substrates have outer diameters of 130 and 95 mm (5.1 and 3.74 inches), with corresponding inner diameters of 40 and 25 mm (1.57 and 0.98 inches), respectively. Exemplary discs used in the media of the invention have inner diameters of 0.837 inches and outer diameters of 1.768 inches. The inner and outer edges of the disc which define these diameters are indicated at 36, 38, respectively, in FIG. 1.

The sputtered crystalline underlayer is preferably a sputtered chromium underlayer having a thickness between about 300–3,000 Å. High coercivity, remanence and loop squareness values are achieved particularly at an underlayer thickness of between about 1,000–3,000 Å. Chromium-containing alloys, such as CrV, CrGd and CrSi, may also be suitable, as may a tungsten underlayer.

Gradient layer 25 at the boundary of the Cr underlayer and the magnetic thin film is formed of an axial composition gradient, i.e., a gradient in the direction normal to the planes of the sputtered medium layers. The gradient layer contains progressively more of the alloy composition $M_1$ (indicated by light shading) and progressively less of the underlayer Cr metal (indicated by dark shading) on progressing away from the underlayer and toward the magnetic thin film. The gradient layer has a preferred thickness, as defined below, between about 20–100 Å.

The two sputtered thin-film magnetic sublayers in the thin-film structure are composed of Co-based magnetic alloys, indicated at $M_1$ and $M_2$, as noted above. Such alloys contain Co and one or more of the elements Ni, Pt, Nb, Cr, Ta, V, W, B, Zr, Si, Hf, P. Exemplary alloys include Co/Cr/Ta, Co/Cr/Pt, Co/Cr/Ni, Co/Cr/Ta/Pt, Co/Cr/Ta/Ni, Co/Cr/Ta/Pt/B and Co/Ni/Pt. The alloy compositions forming the lower and upper magnetic sublayers are also referred to herein as $M_1$ and $M_2$, respectively. In one general embodiment, the two sublayers are both formed of the same magnetic alloy, i.e., $M_1=M_2$. An exemplary alloy in this embodiment is a Co/Cr/Ta alloy containing 70–85 atom percent cobalt, 5–20 atom percent chromium, and 2–10 atom percent tantalum.

In another general embodiment, the lower thin-film sublayer is composed of a first Co-based alloy ($M_1$), and the upper thin-film sublayer is composed of a second Co-based alloy ($M_2$). In one preferred embodiment, the lower sublayer alloy $M_1$ has relatively low noise and magnetic remanence characteristics, when deposited by sputtering as a single magnetic layer, and the upper sublayer alloy $M_2$ has relatively high magnetic remanence characteristics. Alternatively, the upper sublayer alloy could have lower noise, lower remanence characteristics.

One exemplary alloy in the lower sublayer in this embodiment is the Co/Cr/Ta alloy described above. One exemplary alloy forming the upper sublayer is the above Co/Cr/Ta alloy containing 3–30 atom percent Ni or Pt. Another exemplary alloy forming the upper sublayer is a Co/Ni/Cr alloy composed of 55–70 atom percent cobalt, 20–40 atom percent nickel, and 3–10 atom percent chrome. One specific example contains 62.5 atom percent cobalt, 30 atom percent nickel, and 7.5 atom percent chrome.

The nonmagnetic metal in the isolation layer of the thin-film structure may be Cr, Ti, Mo, Zr, Al, W, Si, Nb, Ta, Y, Hf, Au, Ag, V, B, Gd, Cu, Re or Ru, and is preferably Cr or a Cr-containing alloy. According to an important aspect of the invention, the isolation layer between the two magnetic sublayers is an axial composition gradient containing progressively less of the nonmagnetic metal, and progressively more of a selected Co-based magnetic alloy, on progressing toward the plane of the sublayer composed of that alloy. The isolation layer has a preferred thickness between about 20–100 Å. Specifically, the portion of the gradient isolation layer containing more than about 50 atom percent of the nonmagnetic metal, e.g., Cr, is between about 20–100 Å.

As will be described below, the compositional gradient in the FIG. 1 embodiment is formed under conditions in which the isolation layer is composed predominantly of Cr at its lowermost portion in the figure (indicated at 34 by dark shading in the figure), and contains progressively less chromium and progressively more of the $M_2$ alloy (indicated by the light shading) on progressing axially toward the upper sublayer.

The carbon overcoat in the thin-film medium is preferably a carbon layer formed by sputtering carbon onto the magnetic layer, under conditions in which the carbon is in a predominantly diamond-like structure. The overcoat thickness is preferably between about 100 and 300 Å.

Figure 2:
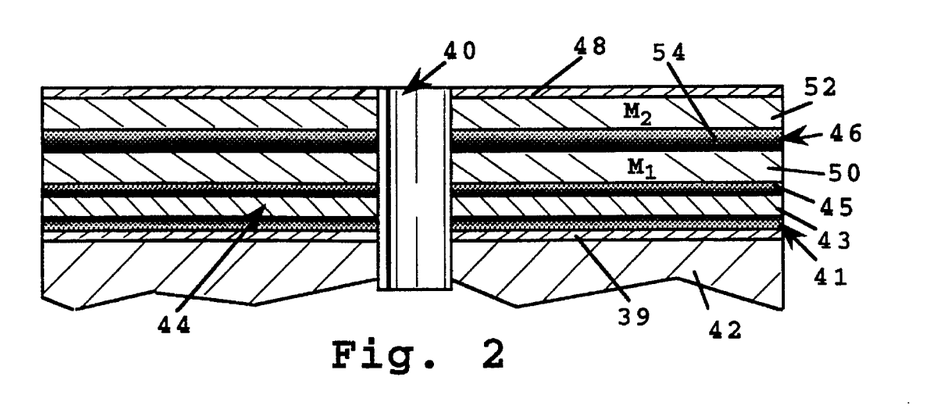
FIG. 2 is a cross-sectional view of a thin-film magnetic disc formed in accordance with a second embodiment of the invention.

FIG. 2 shows in cross section view, a fragmentary portion of a thin-film medium or disk 40 formed in accordance with another embodiment of the present invention. Medium 40 differs from above-described medium in that (a) the substrate in the medium is a non-metallic substrate, and (b) the underlayer is a multilayered structure. More specifically, medium 40 includes a non-metallic substrate 42, and forming successive thin-film layers over the substrate, a multilayered sputtered underlayer structure 44, a compositional gradient layer 45, a sputtered multilayered magnetic thin-film structure 46 and a protective overcoat 48.

The non-metallic substrate in medium 40 may be either a glass, carbon, silicon, glass-ceramic, or ceramic substrate. An example of a glass-ceramic substrate is a Canasite™ substrate. Such substrates are formed initially as an amorphous glass, then heated under conditions which produce a crystalline, ceramic phase. A ceramic substrate may be formed conventionally by scintering alumina particles, then coating the ceramic with a glass surface coating. Such substrates, which are commercially available, have a thickness of about 1.27 mm for a 95 mm disc, and conventional testing is done at ID/OD values of about 0.8 inch and 1.78 inch, respectively.

One method for texturing a glass substrate is described in parent U.S. patent application for "Glass Substrate with Controlled Low-Friction Surface," Ser. No. 475,715, filed Feb. 6, 1990, which is incorporated by reference herein. Alternatively, the glass or ceramic substrate may be microroughened by known mechanical texturing methods. In still another embodiment, a disk substrate having a desired surface texturing may be obtained from commercial sources. One such commercial substrate is a canasite™ ceramic substrate available from Corning Glass (Corning, N.Y.).

The underlayer structure in medium 40 includes a lower metal coating layer 39, a lower gradient sublayer 41, and a Cr sublayer 43. The metal coating layer is composed of Ti, V, W, Si, Mo, Nb, Ag, B, Al, Gd, or Ni/P, or combinations thereof. One preferred coating metal in the underlayer is Ti (titanium). Other preferred coating metals are W (tungsten), V (vanadium) and Al (aluminum). The coating has a preferred thickness between about 50–200 Å; that is, the layer containing at least about 50 atom percent of the coating metal has this specified thickness.

Sublayer 41 is a compositional gradient between sublayers 39, 43. As will be seen below, the gradient sublayer is formed under conditions in which the sublayer contains progressively less of the coating metal, and progressively more Cr on progressing axially between sublayers 39, 43. The gradient sublayer has a preferred thickness between about 20–100 Å.

Sublayer 43 is composed of Cr or a Cr alloy, as described above with respect to Cr underlayer 24 in Medium 20.

In one general embodiment, the underlayer structure has a thickness between 100–300 Å, as described in co-owned U.S. patent application for "Thin-Film Recording Medium With Thin Chromium Underlayer," Ser. No. 07/964,745, filed Oct. 22, 1992, which is incorporated by reference herein. In a preferred embodiment, the underlayer structure has a thickness between 500–4,000 Å, and preferably 1,000–4,000 Å, with the lower two sublayers having a combined thickness of between about 100–300 Å.

Structure 46 in medium 40 is composed of a lower sputtered magnetic thin-film sublayer 50, like sublayer 30, an upper sputtered magnetic thin-film sputtered sublayer 52, like sublayer 32, and a sputtered gradient isolation layer 54, like gradient isolation layer 34. As in the FIG. 1 embodiment, the two magnetic sublayers may be composed of the same or different Co-based magnetic alloys. Overcoat 48 in medium 40 is like overcoat 28 in medium 20.

Figure 3:
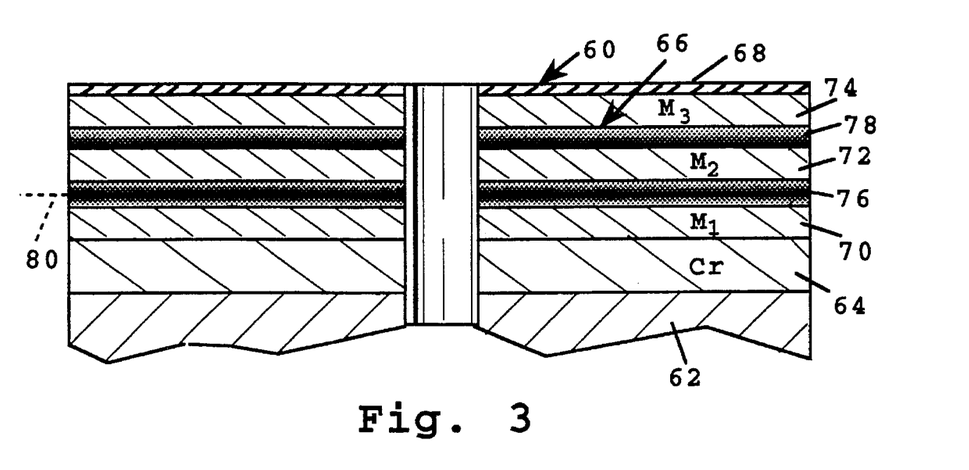
FIG. 3 is a cross-sectional view of a thin-film magnetic disc formed in accordance with a third embodiment of the invention.

FIG. 3 shows in cross section view, a fragmentary portion of a thin-film medium or disk 60 formed in accordance with a third embodiment of the present invention. The medium differs from medium 20 above in that (a) the multilayered thin film magnetic structure is composed of three magnetic sublayers and two isolation layers, and (b) the multilayered structure is formed directly over a Cr underlayer, i.e., without a compositional gradient therebetween. More specifically, medium 6 includes a metallic substrate 62, and forming successive thin-film layers over the substrate, a sputtered underlayer 64, a sputtered multilayered magnetic thin film structure 66 and a protective overcoat 68. Substrate 62, chromium underlayer 64 and overcoat 28 in medium 60 are substantially identical to substrate 22, underlayer 24, and overcoat 28, respectively, in medium 20.

The magnetic thin-film structure in medium 60 is composed of lower, intermediate, and upper sputtered magnetic sublayers 70, 72, 74, respectively. The lower sublayers 70, 72 are separated by a sputtered gradient isolation layer 76, and the upper two sublayers, by a gradient isolation layer 78.

The three sputtered thin-film magnetic sublayers, forming the magnetic thin film in the medium are composed of Co-based magnetic alloys, such as described above. The three sublayers, whose alloy compositions are also referred to herein as $M_1$, $M_2$, and $M_3$, may have the same alloy composition, i.e., $M_1=M_2=M_3$, such as the Co/Cr/Ta alloy described above.

Alternatively, the lowermost sublayer may be composed of a first Co-based alloy ($M_1$) having relatively low noise and magnetic remanence characteristics, when deposited by sputtering as a single magnetic layer, and the uppermost thin-film sublayer, or the upper two sublayers, composed of a second Co-based alloy ($M_3$) having relatively high magnetic remanence characteristics, such as described above. The intermediate sublayer may have an alloy composition $M_2$ identical to either the lowermost or uppermost sublayer, or may have a composition whose noise and magnetic remanence characteristics are intermediate between the two.

The lower gradient isolation layer 76 in this embodiment is symmetrical about a center plane, indicated by dotted line 80 in the figure, through the center of the gradient. On the lower side of this plane in the figure, the gradient contains progressively less Cr (indicated by dark shading) and progressively more of alloy composition $M_1$ (light shading) on progressing toward sublayer 70. On the upper side of the plane in the figure, the gradient contains progressively less Cr (indicated by dark shading) and progressively more of alloy composition $M_2$ (light shading) on progressing toward sublayer 70.

The isolation layer, i.e., the portion of sublayer 76 containing more than about 50 atom percent chromium, has a preferred thickness of between 20–100 Å.

The second isolation layer 78 is substantially identical to layer 34 described with respect to FIG. 1, and contains progressively less Cr (dark shading) and progressively more $M_3$ alloy (light shading) on progressing toward sublayer 74. This isolation layer also has a preferred thickness between about 20–100 Å.

It will be appreciated that only the "upper" sides of the media have been described, and that the opposite, "lower" side of the media will preferably include the same multi-layered media construction. It will also be appreciated that the unique elements described with respect to each of the three embodiments, may be combined. For example, a medium may have a non-metallic substrate and underlayer structure such as described with respect to FIG. 2, and a magnetic structure having three (or more) magnetic sublayers such as described with respect to FIG. 3.

II. Method of Producing the Medium

A conventional sputtering apparatus (not shown) may be used in the method of the invention for producing the thin-film medium described in Section I. The apparatus includes a vacuum chamber having preferably four stations at which heating or sputtering operations occur. A heating station at the upstream end of the chamber has a plurality of infrared lights which are arrayed for heating both sides of a substrate carried through the station in the chamber on a disc holder or pallet.

Downstream of the heating station are two sputtering stations at which are sputtered the chromium underlayer and the multilayered magnetic thin film structure, in accordance with the present invention, and a third sputtering station at which the overcoat is sputtered. Where the medium has the construction shown in FIG. 3, the apparatus may include an additional sputtering chamber at which the Cr underlayer is formed, as described below.

The basic sputtering apparatus is preferably a commercial system, such as in available from Varian/Intevac (Santa Clara, Calif.), Circuits Processing Apparatus (Fremont, Calif.), ULVAC (Japan), Leybald Heraeus (Germany), VACTEC (Boulder, Colo.), or Materials Research Corporation (Albany, N.Y.) Anelva, Japan. These systems are double-sided, in-line, high-throughput machines having two interlocking systems, for loading and unloading, and typically include a heating station and three separate sputtering stations.

The sputtering apparatus is preferably designed for operation in a DC magnetron mode, or in an RF diode mode. In the magnetron mode, the plasma is focused by magnetic field lines generated below the target. In the diode mode, the plasma is excited by an RF power source. In either embodiment, the magnetic field lines or RF power source can be applied differentially to each target segment to produce a selected sputtering rate from each segment.

In operation, the sputtering chamber is evacuated to pressure of about $10^{-7}$ Torr, and argon gas is introduced into the chamber to a final sputtering pressure of 5–20 mTorr. The substrate is heated in the heating station to a selected temperature before advancing into the three sputtering chambers. The heating conditions in the apparatus are preferably adjusted to achieve a substrate temperature of between about 200° C., and preferably about 270° C.

Figure 4:
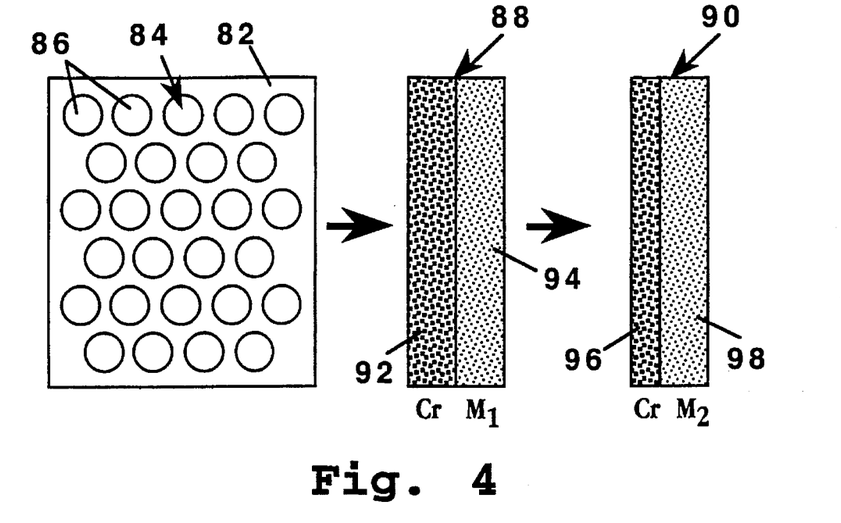
FIG. 4 is a simplified plane view showing a pallet of discs prior to passage through upstream and central sputtering stations in a sputtering apparatus used in producing the thin-film medium of the invention shown in FIG. 1.

FIG. 4 shows a pallet 82 containing an array 84 of individual substrates, such as substrates 86. The pallet is carried successively through the three sputtering chambers, in an upstream-to-downstream direction (indicated by the arrows in FIG. 4).

The figure also shows segmented targets 88, 90 in the first and second sputtering chambers, respectively, for use in forming the multilayered medium shown in FIG. 1. Target 88 is formed of an upstream portion 92 composed of Cr, and an abutting downstream portion 94 composed of alloy $M_1$. Target 90 is similarly formed of an upstream portion 96 composed of Cr, and an abutting downstream portion 98 composed of alloy $M_2$. The two targets both have a width corresponding to the width of the pallet so that all discs are consistently sputtered with the target alloys as the pallet passes through the sputtering station, as can be appreciated from FIG. 4.

Figure 5A:
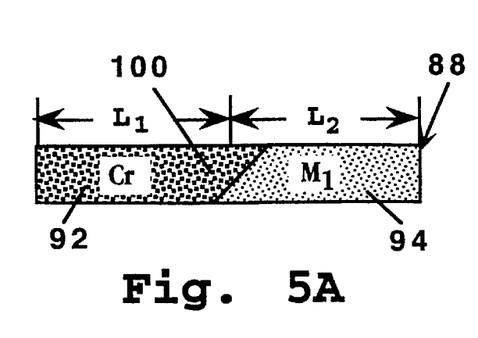
FIGS. 5A and 5B are end views of the sputtering targets in the upstream and central stations, respectively, referred to in FIG. 4, for use in producing the thin-film medium of the invention shown in FIG. 1.
Figure 5B:
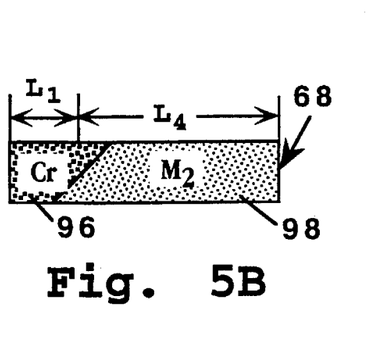

As seen in side view in FIG. 5A, the upstream and downstream portions of target 88 are formed as a unitary single target. The two portions are joined along an angled face 100 in order to facilitate adhesion during manufacture. Other forms of targets are also within the contemplation of the invention. For example, the two portions could be slightly spaced apart if a reduced intermediate stratum is desired relative to lower and upper stratums. Also as seen in the figure, the average lengths, $L_1$ and $L_2$, of the two portions are approximately equal. Target 90 is similarly formed, as shown in FIG. 5B, with the length $L_3$ of the upstream portion being substantially less than the length $L_4$ of the downstream portion. The relative dimensions of the upstream and downstream portions of the segmented targets can be varied to selectively vary the amount of deposition from each portion, as will be appreciated below.

Figure 6A:
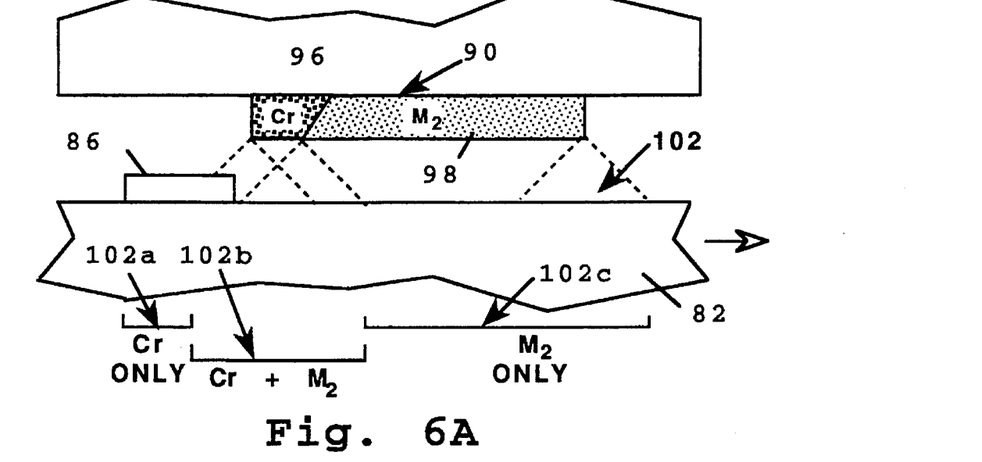
FIGS. 6A–6C are simplified end views of the central sputtering station of FIG. 4, illustrating sputtering deposition of a gradient isolation layer and an upper thin-film magnetic sublayer, in accordance with the method of the invention.
Figure 6B:
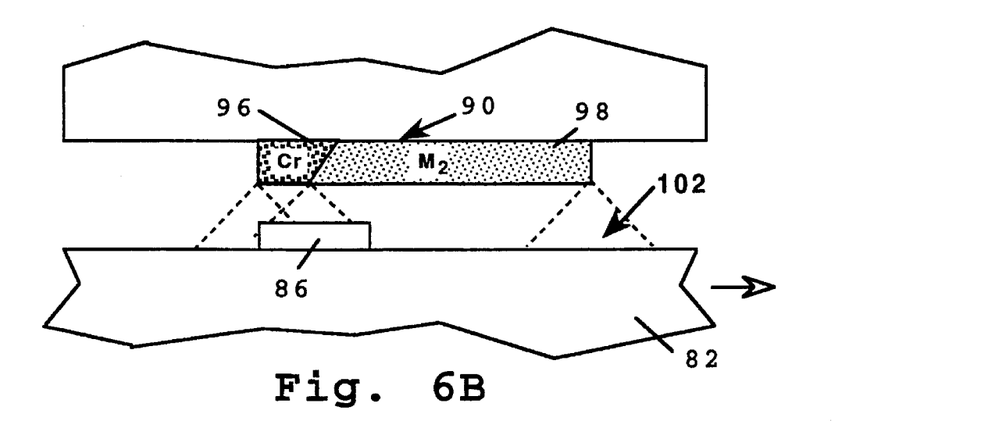
Figure 6C:
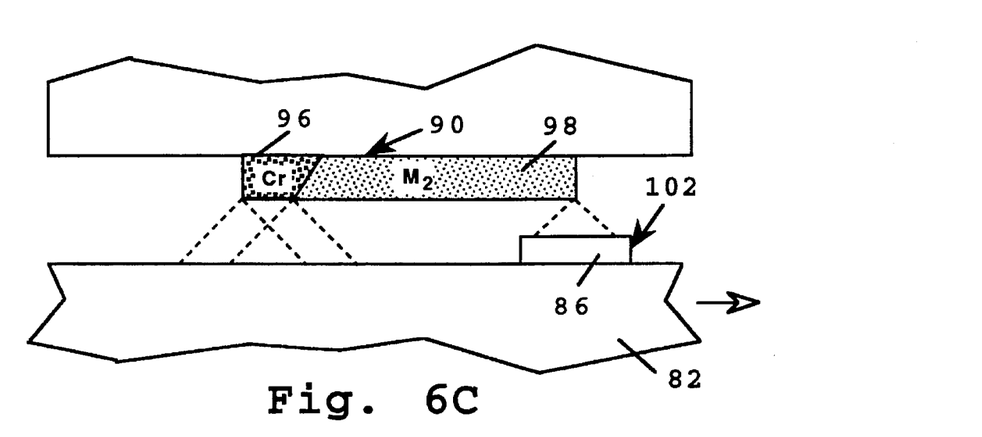

FIGS. 6A–6C illustrate the process of forming the gradient isolation layer 34 and upper magnetic sublayer 32 in medium 20 shown in FIG. 1, in accordance with the invention. FIG. 6A illustrates a substrate 86 carried on pallet 82 as the substrate is entering the upstream region 102a of the second sputtering station 102 in which the isolation layer and second magnetic sublayer will be formed. Although not shown here, the substrate has already passed through a first sputtering station at which a Cr underlayer, a gradient sublayer, and the first magnetic sublayer have been formed successively on the substrate surface, by passage through a first sputtering zone equipped with target 88 shown in FIGS. 4 and 5A. It is also noted that FIGS. 6A–6C show only the "upper" target in a sputtering zone, it being recognized that a similar lower target is employed to create the same media layers on the opposite side of the substrate.

With continued reference to FIG. 6A, the substrate surface will initially see only sputtered Cr material from the upstream segment of the target, here indicated at 96. This initial deposition of Cr material only produces the lower stratum of the underlayer which is composed predominantly of Cr. The upstream region in which the substrate receives only or predominantly sputtered Cr is indicated at 102a in the figure.

As the target moves into the sputtering zone, it receives progressively more sputtered material from the downstream segment of the target, indicated at 98. When the disc reaches the position shown in FIG. 6B, directly below the interface between the two target segments, the disc will receive material from the two target segments in the same ratio as the target deposition rates from the two segments, e.g., approximately equal amounts Cr and $M_2$. The region in which progressively less Cr and progressively more $M_2$ is sputtered onto the substrate is indicated at 102b in FIG. 6A. It is in this region that the isolation sublayer gradient is formed.

Finally, as the target moves into the center region of the sputtering zone it will receive sputtered material from downstream segment 98 only, ultimately producing the uppermost stratum composed of $M_2$ only (the chromium stratum). The region in which the upper magnetic sublayer is formed is indicated at 102c in the FIG. 6A.

Figure 7:
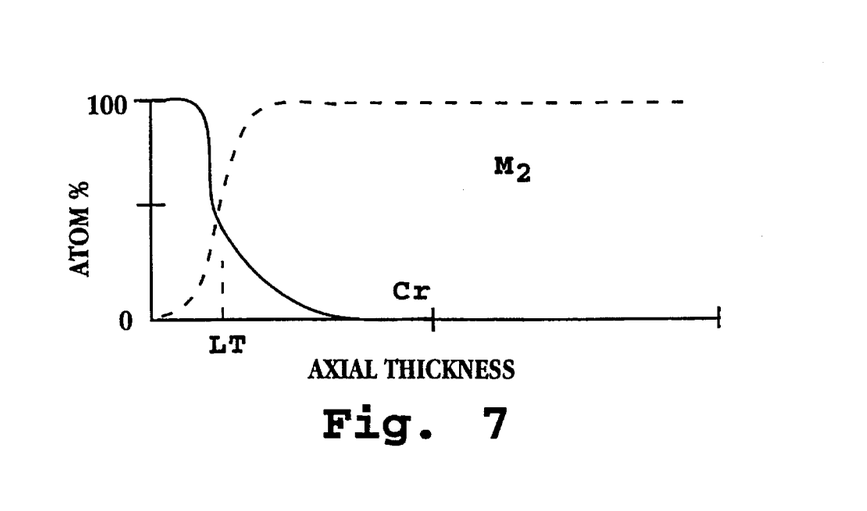
FIG. 7 is a plot of the Cr and Co/Cr/Ta composition gradients formed in the sputtering carried out in accordance with FIGS. 6A–6C.

FIG. 7 shows the axial Cr and $M_2$ compositions forming the gradient isolation layer and adjacent magnetic underlayer formed by sputtering from the segmented target as just described. The ordinate in the figure represents atom percent of each composition Cr and $M_2$, and the abscissa, axial thickness on progressing from the lowermost stratum of the gradient isolation layer to the top of the magnetic sublayer. The point of crossover of the two compositions represents the thickness at which the percentage of Cr from target segment 96 is 50 atom percent, and defines the thickness of the gradient isolation layer.

It can be appreciated from the foregoing how movement of a heated substrate initially through the first sputtering station having target 88 shown in FIGS. 4 and 5A produces lower Cr underlayer 24, compositional Cr/$M_1$ gradient layer 25, and lower magnetic sublayer 30 forming the lower three layers in medium 20 in FIG. 1.

After the substrate has moved through the two sputtering stations, it is advanced to the final sputtering station where sputtered overcoat layer 28 in the medium is formed.

Figure 8A:
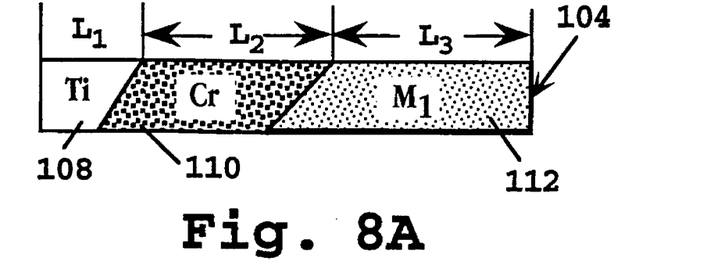
FIGS. 8A and 8B are end views of the sputtering targets in the upstream and central stations, respectively, for use in producing the embodiment of the thin-film medium shown in FIG. 2.
Figure 8B:
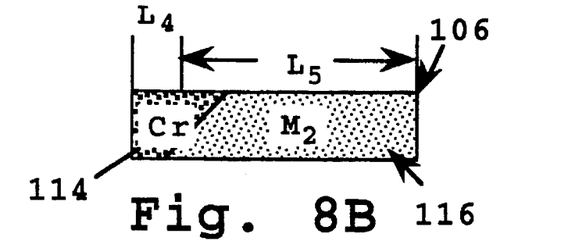

FIGS. 8A and 8B show side views of segmented upstream and downstream targets 104, 106, respectively, used in forming medium 40 described with respect to FIG. 2. Target 104 includes an upstream segment 108 composed of the substrate coating metal, such as Ti, an intermediate segment 110 composed of Cr, and a downstream segment 112 composed of the $M_1$ alloy. The relative lengths of the three segments, $L_1$, $L_2$, and $L_3$, are selected to produce a selected thickness of lower coating sublayer 39, Cr underlayer 43, and lower magnetic sublayer 50, respectively.

Target 106 includes an upstream segment 114 composed of Cr and a downstream segment 116 composed of the $M_2$ alloy. The relative lengths of the three segments, $L_4$ and $L_5$ are selected to produce a selected thickness of gradient isolation layer 54 and upper magnetic sublayer 52, respectively.

Movement of a substrate through a first sputtering station containing target 104 is effective to produce, sequentially, sputtered substrate coating 39, compositional gradient layer 41, Cr underlayer 43, Cr/$M_1$ compositional gradient layer 45, and lower magnetic 50, essentially as described above. Similarly, movement of the same substrate through a second sputtering station containing target 106 is effective to produce, sequentially, sputtered isolation layer 54 having a Cr/$M_2$ composition gradient, and upper magnetic layer 52 in the medium. The final overcoat is formed at the final downstream sputtering station.

Figure 9A:
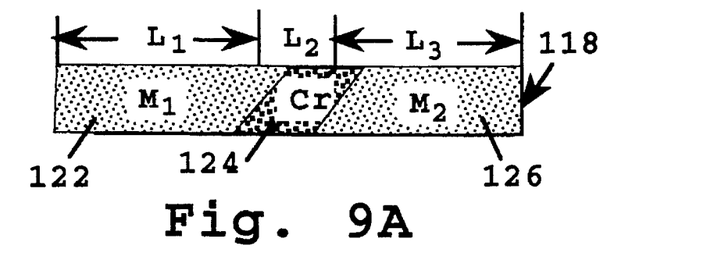
FIGS. 9A and 9B are end views of the sputtering targets in the upstream and central stations, respectively, for use in producing the embodiment of the thin-film medium shown in FIG. 3.
Figure 9B:
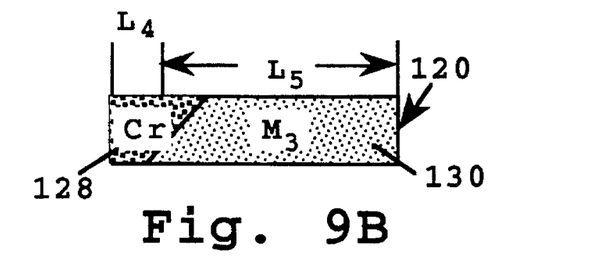

FIGS. 9A and 9B show side views of segmented targets 118, 120, respectively, used in forming the magnetic structure in medium 60 described with respect to FIG. 3. Target 118 includes an upstream segment 122 composed of magnetic alloy $M_1$, an intermediate segment 124 composed of Cr, and a downstream segment 126 composed of the $M_2$ magnetic alloy. The relative lengths of the three segments, $L_1$, $L_2$, and $L_3$, are selected to produce a selected thickness of lower magnetic sublayer 70, isolation gradient layer 76, and intermediate sublayer 72, respectively.

Target 120 includes an upstream segment 128 composed of Cr and a downstream segment 130 composed of the $M_3$ alloy. The relative lengths of the three segments, $L_4$, $L_5$ are selected to produce a selected thickness of gradient isolation layer 78 and upper magnetic sublayer 74, respectively.

In preparing medium 60, a heated substrate is moved through an upstream sputtering station at which Cr underlayer 64 is formed. The substrate is then advanced toward a second sputtering station containing target 118. Movement of a substrate through this second sputtering station is effective to produce, sequentially, lower magnetic sublayer 70 with composition $M_1$, isolation layer 76 with the $M_1$/Cr/$M_2$ gradient composition, and intermediate magnetic sublayer with composition $M_2$.

Similarly, movement of the same substrate through a third sputtering station containing target 106 is effective to produce, sequentially, sputtered isolation layer 78 having a Cr/$M_3$ composition gradient, and upper magnetic layer 52 having composition $M_3$ in the medium. The final overcoat is formed at the final downstream sputtering station.

From the foregoing, it can be appreciated how various objects and features of the invention are met. One advantage provided by this approach is that two or more sublayers, such as Cr magnetic alloy sublayers, can be formed efficiently within a single sputtering zone, increasing the speed and efficiency of producing sputtered thin-film media, and avoiding the need to modify conventional sputtering machines to accommodate additional sputtering stations.

The multilayered media produced have low noise characteristics, because of the thin, isolated magnetic sublayers forming the magnetic structure in the media, but high signal amplitude characteristics, due to the combined thicknesses of the two or more magnetic sublayers in the medium. In addition to high SNR characteristics, the multilayered magnetic structure contributes to high coercivity properties.

Although the invention has been described with respect to particular embodiments, it will be apparent to those skilled in the art that various changes and modifications can be made without departing from the invention.

It is claimed:

1. In a magnetic thin-film medium composed of (i) a substrate, (ii) a sputtered chromium underlayer, (iii) sputtered lower and upper thin-film magnetic sublayers, each composed of a Co-based magnetic alloy, (iv) a sputtered isolation layer formed of a nonmagnetic metal separating the two thin-film magnetic sublayers, said isolation layer having a thickness of between 20–100 Å, and (v) a protective overcoat, an improvement in which the sputtered isolation layer includes an axial composition gradient of said nonmagnetic metal and said Co-based alloy, where the percentage of said nonmagnetic metal decreases on progressing away from said isolation layer and toward said upper magnetic sublayer.

2. The medium of claim 1, wherein the substrate is an aluminum substrate with a nickel-phosphorus coating, and the chromium underlayer has a thickness of between about 200 and 4,000 Å.

3. The medium of claim 1, wherein the substrate is a nonmetallic substrate and said Cr underlayer is a sputtered underlayer having an axial composition gradient in which a lowermost stratum of the layer, immediately adjacent the substrate, is composed of a coating metal selected from the group consisting of Ti, Ti/W, W, Mo, Zr, Sn, Zn, Si, Nb, Ta, Hf, Au, Ag, Cu, V, B and rare-earth elements, and an uppermost stratum of the underlayer is composed of Cr.

4. The medium of claim 1, wherein the nonmagnetic metal in the isolation layer is chromium, and each of the thin-film layers has a thickness between about 50 and 300 Å.

5. The medium of claim 1, wherein the sputtered isolation layer contains an axial compositional gradient having an intermediate region and upper and lower regions on either side of the intermediate region, where said intermediate region contains a greater percentage of chromium than do said upper and lower regions, and said upper and lower regions contain a greater percentage of the Co-based alloy than does said intermediate region.

6. The medium of claim 1, which further includes a third magnetic sublayer, and a compositional gradient between the second and third magnetic sublayers.

7. The medium of claim 3, wherein each magnetic layer is composed of an alloy containing cobalt, chromium, and tantalum.

8. The medium of claim 3, wherein said lower thin-film layer is composed of a first Co-based alloy $M_1$ having noise and magnetic remanence characteristics that, when deposited by sputtering as a single magnetic layer, are lower than those of said upper thin-film sublayer, and said upper thin-film sublayer is composed of a second Co-based alloy $M_2$.

9. The medium of claim 5, wherein each magnetic layer is composed of an alloy containing cobalt, chromium and tantalum.

10. The medium of claim 5, wherein said lower thin-film sublayer is composed of a first Co-based alloy $M_1$ having noise and magnetic remanence characteristics that, when deposited by sputtering as a single magnetic layer, are lower than those of said upper thin-film sublayer, and said upper thin-film sublayer is composed of a second Co-based alloy $M_2$.

11. The medium of claim 5, wherein $M_1$ is composed of an alloy containing cobalt, chromium and tantalum, and $M_2$ is composed of an alloy selected from the group consisting of an alloy containing cobalt and chromium, an alloy containing cobalt, chromium, tantalum and nickel, an alloy containing cobalt, chromium, tantalum and platinum, and an alloy containing cobalt, chromium, tantalum, platinum and nickel.

* * * * *